(12) United States Patent
Sanduleanu et al.

(10) Patent No.: US 7,821,342 B2
(45) Date of Patent: Oct. 26, 2010

(54) DEVICE COMPRISING A FEEDBACK-LESS GAIN CONTROLLED AMPLIFIER

(75) Inventors: Mihai Adrian Tiberiu Sanduleanu, Maastricht (NL); Eduard F. Stikvoort, Eindhoven (NL)

(73) Assignee: ST-Ericsson SA, Geneva (CH)

( * ) Notice: Subject to any disclaimer, the term of this patent is extended or adjusted under 35 U.S.C. 154(b) by 0 days.

(21) Appl. No.: 11/994,783

(22) PCT Filed: Jul. 3, 2006

(86) PCT No.: PCT/IB2006/052226

§ 371 (c)(1),
(2), (4) Date: Aug. 1, 2008

(87) PCT Pub. No.: WO2007/004189

PCT Pub. Date: Jan. 11, 2007

(65) Prior Publication Data

US 2009/0121789 A1 May 14, 2009

(30) Foreign Application Priority Data

Jul. 4, 2005 (EP) .................................. 05106034

(51) Int. Cl.
*H03F 3/04* (2006.01)
(52) U.S. Cl. ...................................... 330/311; 330/254
(58) Field of Classification Search .................. 330/254, 330/311
See application file for complete search history.

(56) References Cited

U.S. PATENT DOCUMENTS

| | | | |
|---|---|---|---|
| 5,999,052 A | 12/1999 | Tang | |
| 6,229,374 B1 * | 5/2001 | Tammone, Jr. | 327/350 |
| 6,472,936 B1 * | 10/2002 | Jones | 330/51 |
| 6,791,413 B2 | 9/2004 | Komurasaki et al. | |
| 2002/0048109 A1 | 4/2002 | Chaiken et al. | |
| 2004/0119536 A1 | 6/2004 | Kwon et al. | |
| 2004/0135632 A1 | 7/2004 | Kwon et al. | |

FOREIGN PATENT DOCUMENTS

EP 1513252 A1 3/2005

OTHER PUBLICATIONS

Shi, Bo; et al "A 200-MHZ IF BICMOS Signal Component Separator for Linear Linc Transmitters" IEEE Journal of Solid-State Circuits, IEEE Service Center, vol. 35, No. 7, Jul. 2000, pp. 987-993.

(Continued)

*Primary Examiner*—Robert Pascal
*Assistant Examiner*—Khiem D Nguyen (57) ABSTRACT

Devices (1,2) comprising feedback-less amplifiers (16,19,26, 29) that are gain controlled introduce linear relationships between output signals and input signals of the feedback-less amplifiers (16,19,26,29) by providing the feedback-less amplifiers (16,19,26,29) sub-circuits in the form of first transistors (33) operated in their triode regions for receiving input signals and second sub-circuits in the form of second transistors (34) for receiving control signals and third sub-circuits in the form of resistors (35) for generating output signals, whereby the respective first and second and third sub-circuits form a serial path. Second circuits (4) receive gain signals and convert the gain signals into the control signals. The control signals are copies of the gain signals. The second circuits (4) comprise current sources (6) and third and fourth transistors (41,42). The current sources (6) comprise fifth and sixth transistors (61,62). The second circuits (4) further comprise voltage sources (9) further current sources. Third circuits (8) compensate common mode currents.

20 Claims, 3 Drawing Sheets

OTHER PUBLICATIONS

International Search Report dated Jan. 26, 2007 in connection with PCT Application No. PCT/IB2006/052226.

Written Opinion of the International Searching Authority dated Jan. 4, 2008 in connection with PCT Application No. PCT/IB2006/052226.

* cited by examiner

DEVICE COMPRISING A FEEDBACK-LESS GAIN CONTROLLED AMPLIFIER

CROSS-REFERENCE TO RELATED APPLICATION(S)

The present application claims priority under 35 U.S.C. §365 to International Patent Application No. PCT/IB2006/052226 filed Jul. 3, 2006, entitled "DEVICE COMPRISING A FEEDBACK-LESS GAIN CONTROLLED AMPLIFIER". International Patent Application No. PCT/IB2006/052226 claims priority under 35 U.S.C. §365 and/or 35 U.S.C. §119(a to European Patent Application No. 05106034.1 filed Jul. 4, 2005 and which are incorporated herein by reference into the present disclosure as if fully set forth herein.

BACKGROUND

Field of the Invention

The invention relates to a device comprising a feedback-less amplifier, and also relates to a feedback-less amplifier, and to a feedback-less amplifying method.

Examples of such a device are radio frequency receivers and/or radio frequency transmitters and/or radio frequency transceivers. Examples of such a feedback-less amplifier are feedback-less gain controlled intermediate frequency amplifiers.

A prior art device is known from U.S. Pat. No. 6,791,413 B2, which discloses a variable gain amplifier with a gain exhibiting a linear in dB characteristic relative to a control voltage. So, this amplifier is a linear gain amplifier in dBs. There is a linear relationship between an output voltage and a gain factor in dBs. However, as shown in FIG. 2 of U.S. Pat. No. 6,791,413 B2, there is a non-linear relationship between the output voltage and an input voltage.

By introducing a feedback loop inside an amplifier, an originally non-linear relationship between an output voltage and an input voltage can be turned into a linear relationship between the output voltage and the input voltage easily. However, such amplifiers comprising feedback loops have limited frequency ranges.

The known device is disadvantageous, inter alia, owing to the fact that its feedback-less amplifier has a relatively non-linear relationship between the output voltage and the input voltage. The output voltage depends on the input voltage in a relatively non-linear way. Further, this feedback-less amplifier has a relatively small input voltage range and only functions properly for relatively small input voltages.

SUMMARY OF THE INVENTION

It is an object of the invention, inter alia, to provide a device comprising a feedback-less amplifier that is relatively linear from an input signal to an output signal.

Further objects of the invention are, inter alia, to provide a feedback-less amplifier that is relatively linear from an input signal to an output signal and to provide a feedback-less amplifying method that is relatively linear from an input signal to an output signal.

Yet further objects of the invention are, inter alia, to provide a device, a feedback-less amplifier and a feedback-less amplifying method that have relatively large frequency ranges and relatively large input signal ranges.

The device according to the invention comprises a feedback-less amplifier, the feedback-less amplifier comprising:

a first circuit comprising a first sub-circuit for receiving an input signal and a second sub-circuit for receiving a control signal and a third sub-circuit for generating an output signal, the respective first and second and third sub-circuits forming a serial path, and a second circuit for receiving a gain signal and for converting the gain signal into the control signal.

By introducing the first circuit comprising three serially coupled sub-circuits, whereby the outer sub-circuits are arranged to receive the input signal and to generate the output signal and the middle sub-circuit is arranged to receive the control signal from the second circuit, and by introducing the second circuit different from the first circuit, which second circuit is arranged to receive the gain signal and to convert the gain signal into the control signal, a feedback-less gain controlled amplifier has been created that has a relatively linear relationship between the output signal and the input signal. This results from the fact, inter alia, that the middle sub-circuit has two functions. Firstly, it controls the serial path (the gain of the amplifier) and secondly, it separates the outer sub-circuits from each other.

The invention is further advantageous, inter alia, in that the amplifier is a feedback-less amplifier, which results in a larger frequency range, and in that the amplifier has a relatively large input signal range. The latter results from the fact, inter alia, that the outer sub-circuits are separated from each other by the middle circuit.

It should be noted that a feedback-less amplifier is defined to be an amplifier that does not have a feedback loop between two or more sub-circuits within the amplifier and/or that does not have a feedback loop in a signal path. Of course, parasitic feedback loops may be present. A feedback-less amplifier may further form part of a feedback loop and does not exclude that such a feedback loop is present. Finally, the feedback-less amplifier may form part of a receiver and/or of a transmitter and/or of a transceiver.

It should further be noted that US 2002/0048109 A1 discloses a dB linear variable gain amplifier. Again, just as for U.S. Pat. No. 6,791,413 B2, an inputting sub-circuit is located between an outputting sub-circuit and a controlling sub-circuit, and a relatively non-linear relationship between the output voltage and the input voltage is present. U.S. Pat. No. 5,999,052 discloses a high-speed, fine-resolution gain programmable amplifier that comprises a feedback loop within the amplifier. This feedback loop forms part of a controlling sub-circuit and comprises a transistor and an opamp (operational amplifier). A source of the transistor is coupled to a negative input of the opamp, and an output of the opamp is coupled to a gate of the transistor. As a result, this amplifier will have a limited frequency range.

An embodiment of the device according to the invention is defined by the first sub-circuit comprising a first transistor operated in a triode region, the first transistor comprising a control electrode for receiving the input signal. Such a first sub-circuit comprising a for example single transistor is of the lowest complexity.

An embodiment of the device according to the invention is defined by the second sub-circuit comprising a second transistor, the second transistor comprising a first main electrode coupled to the third sub-circuit and comprising a second main electrode coupled to a first main electrode of the first transistor. Such a second first sub-circuit comprising a for example single transistor is of the lowest complexity.

An embodiment of the device according to the invention is defined by the third sub-circuit comprising a resistor. Compared to a third sub-circuit or load in the form of a current source, a third sub-circuit or load comprising a resistor will increase the frequency range of the feedback-less amplifier.

The previous three embodiments assume that the input and output signals are singular signals. In case of the input and output signals being differential signals, in addition to the first circuit a further first circuit may be introduced. This further first circuit may comprise a further first sub-circuit for receiving a further input signal and a further second sub-circuit for receiving a further control signal and a further third sub-circuit for generating a further output signal. The respective further first and further second and further third sub-circuits may form a further serial path. The second circuit may further convert the gain signal into the further control signal. The input signal and the further input signal then together form a differential input signal, and the output signal and the further output signal then together form a differential output signal.

An embodiment of the device according to the invention is defined by the control signal being a copy of the gain signal. This embodiment performs well. However, in case of the control signal being derived differently from the gain signal, the relationship between the output signal and the input signal will still be relatively linear.

An embodiment of the device according to the invention is defined by the second circuit comprising a current source coupled to a first main electrode of a third transistor and to a first main electrode and a control electrode of a fourth transistor, a control electrode of the third transistor being coupled to a control electrode of the second transistor and a second main electrode of the third transistor being coupled to a second main electrode of the second transistor, and a second main electrode of the fourth transistor being coupled to a voltage source for generating the gain signal. Via the second and third transistors comprising mutually coupled control electrodes and mutually coupled second main electrodes, the copy of the gain signal can be supplied easily. Further, these second and third transistors will then conduct identical currents.

In case of the input and output signals being differential signals, the second circuit may further comprise a further current source coupled to a first main electrode of a further third transistor and to a first main electrode and a control electrode of a further fourth transistor, a control electrode of the further third transistor being coupled to a control electrode of the further second transistor and a second main electrode of the further third transistor being coupled to a second main electrode of the further second transistor, and a second main electrode of the further fourth transistor being coupled to the voltage source for generating the gain signal. Then, the control electrode of the third transistor may further be coupled to the control electrode of the further fourth transistor, and the control electrode of the further third transistor may further be coupled to the control electrode of the fourth transistor.

An embodiment of the device according to the invention is defined by the current source comprising a fifth and a sixth transistor, a first main electrode of the fifth transistor being coupled to the first main electrode of the third transistor and to the first main electrode and the control electrode of the fourth transistor, a first main electrode of the sixth transistor being coupled to a first main electrode of a seventh transistor, a control electrode of the seventh transistor being coupled to the control electrode of the second transistor and a second main electrode of the seventh transistor being coupled to the second main electrode of the second transistor, and control electrodes of the fifth and sixth transistors being coupled to each other and to the first main electrode of the sixth transistor. Such a current source is of a low complexity.

In case of the input and output signals being differential signals, the further current source may comprise a further fifth and the sixth transistor, a first main electrode of the further fifth transistor being coupled to the first main electrode of the further third transistor and to the first main electrode and the control electrode of the further fourth transistor, a first main electrode of the sixth transistor being further coupled to a first main electrode of a further seventh transistor, a control electrode of the further seventh transistor being coupled to the control electrode of the further second transistor and a second main electrode of the further seventh transistor being coupled to the second main electrode of the further second transistor, and control electrodes of the further fifth and sixth transistors being coupled to each other.

An embodiment of the device according to the invention is defined by the control electrodes of the fifth and sixth transistors further being coupled via a capacitor to a reference terminal. This capacitor filters any extra high frequency components present in a low complex way.

An embodiment of the device according to the invention is defined by the voltage source comprising a further resistor coupled to a further current source. Such a voltage source is of a low complexity.

An embodiment of the device according to the invention is defined by the further resistor comprising an eighth transistor, a ninth transistor and a tenth transistor, the eighth transistor comprising a control electrode coupled to the further current source and via a yet further resistor to a control electrode of the ninth transistor and a second main electrode of the tenth transistor, the eighth transistor comprising a first main electrode coupled to a control electrode of the tenth transistor and via a yet further current source to a reference terminal, the tenth transistor comprising a first main electrode coupled to the reference terminal, the eighth and ninth transistors comprising second main electrodes coupled to ground, and the control electrode of the ninth transistor being coupled via a biasing resistor to ground. This voltage source performs extremely well.

An embodiment of the device according to the invention is defined by further comprising:

a third circuit for compensating a common mode current.

By compensating a common mode current, a performance of the feedback-less amplifier will be improved.

An embodiment of the device according to the invention is defined by the third circuit comprising an eleventh transistor, the eleventh transistor comprising a control electrode coupled to the control electrode of the first transistor and comprising a first main electrode coupled to the second main electrode of the fourth transistor and comprising a second main electrode coupled to the second main electrode of the first transistor. This third circuit is of a lowest complexity. Usually, the third circuit may further comprise a further eleventh transistor, the further eleventh transistor comprising a control electrode coupled to the control electrode of the further first transistor and comprising a first main electrode coupled to the second main electrode of the further fourth transistor and comprising a second main electrode coupled to the second main electrode of the further first transistor.

The invention is based upon an insight, inter alia, that the sub-circuits for receiving the input signal and for generating the output signal can be separated from each other by the sub-circuit for receiving the control signal in the feedback-less amplifier, and is based upon a basic idea, inter alia, that the outer sub-circuits should be arranged to receive the input signal and to generate the output signal and that the middle sub-circuit should be arranged to receive the control signal in the feedback-less amplifier.

The invention solves the problem, inter alia, to provide a device comprising a feedback-less amplifier that is relatively linear from an input signal to an output signal, and is further advantageous, inter alia, in that the amplifier is a feedback-less amplifier, which results in a larger frequency range, and in that the amplifier has a relatively large input signal range.

These and other aspects of the invention will be apparent from and elucidated with reference to the embodiments(s) described hereinafter.

DETAILED DESCRIPTION OF THE INVENTION

Figure 1:
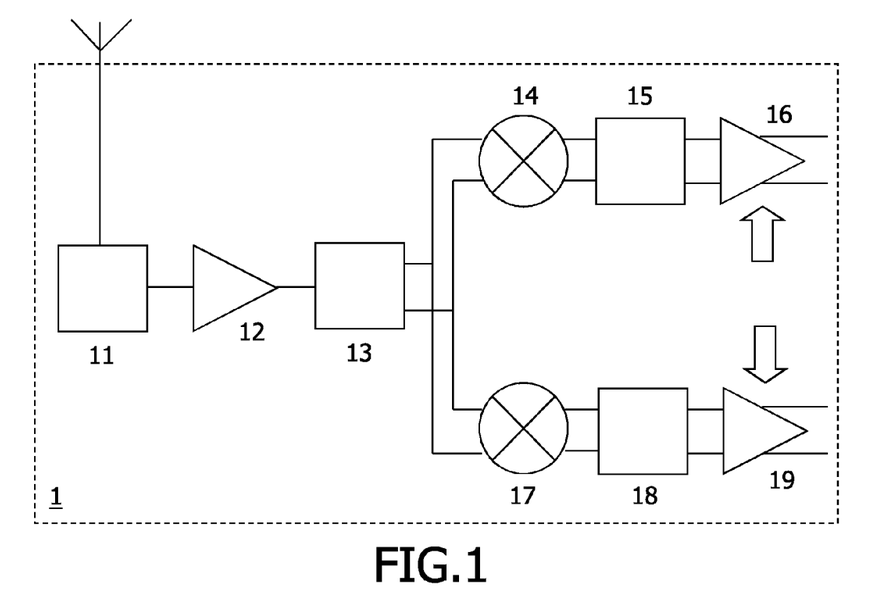
FIG. 1 shows diagrammatically a device according to the invention comprising a feedback-less amplifier according to the invention.

The device 1 according to the invention shown in FIG. 1 comprises an antenna unit 11 coupled via a low noise amplifier 12 and a balun 13 to mixers 14 and 17. The mixer 14 is coupled via a filter 15 to a feedback-less amplifier 16, and the mixer 17 is coupled via a filter 18 to a feedback-less amplifier 19. The feedback-less amplifiers 16 and 19 are gain controlled and are further coupled to intermediate frequency units and/or base band units all not shown.

Figure 2:
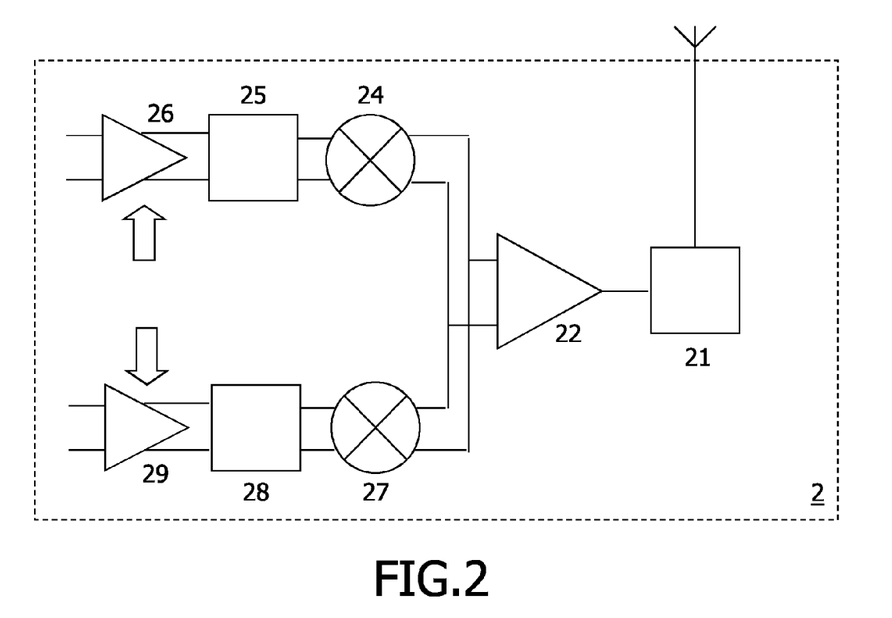
FIG. 2 shows diagrammatically a device according to the invention comprising a feedback-less amplifier according to the invention.

The device 2 according to the invention shown in FIG. 2 comprises base band units and/or to intermediate frequency units all not shown and coupled to feedback-less amplifiers 26 and 29. The feedback-less amplifiers 26 and 29 are gain controlled and are further coupled via filters 25 and 28 and mixers 24 and 27 to a power amplifier 22, which is further coupled to an antenna unit 21.

Figure 3:
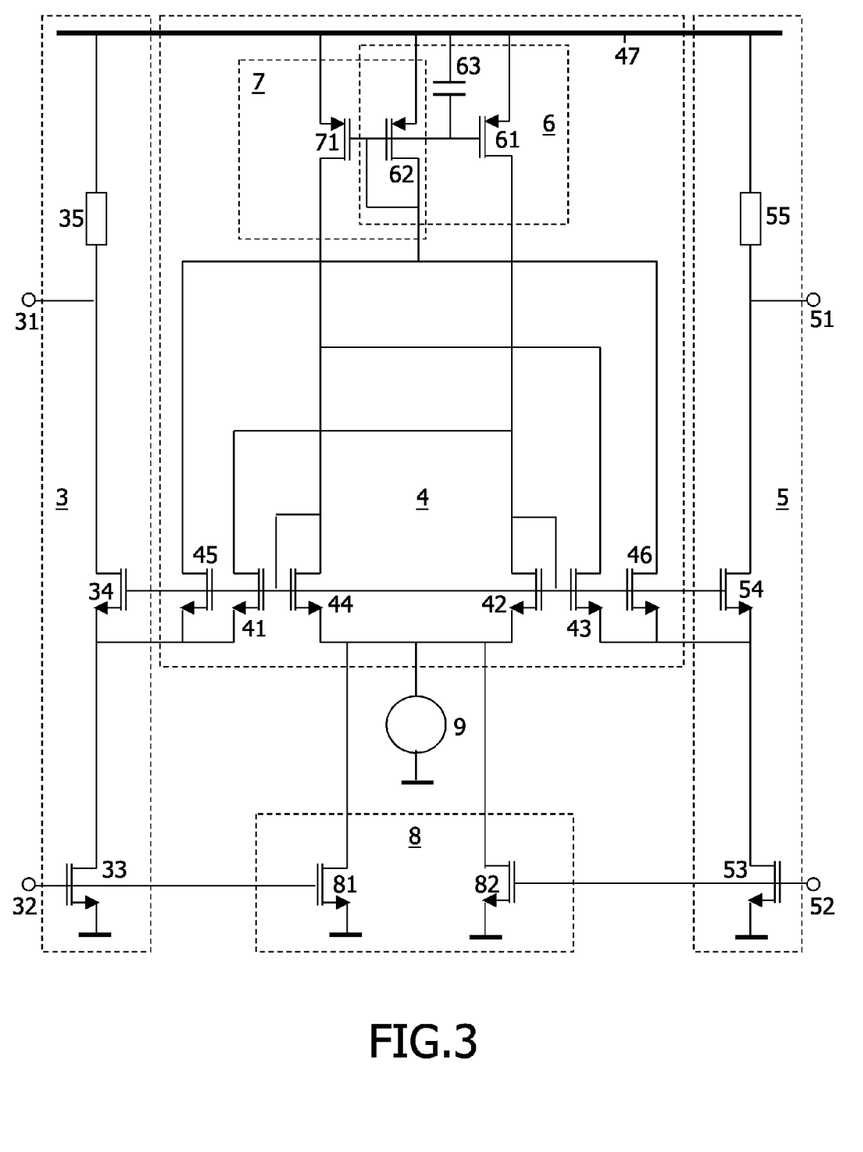
FIG. 3 shows diagrammatically a feedback-less amplifier according to the invention in greater detail.

Each one of the (gain controlled) feedback-less amplifiers 16,19,26,29 is shown in FIG. 3 and comprises a first circuit 3 comprising a first sub-circuit for receiving an input signal via an input 32 and a second sub-circuit for receiving a control signal and a third sub-circuit for generating an output signal via an output 31 and comprises a further first circuit 5 comprising a further first sub-circuit for receiving a further input signal via a further input 52 and a further second sub-circuit for receiving a further control signal and a further third sub-circuit for generating a further output signal via a further output 51. The control signal and the further control signal are supplied by a second circuit 4 that receives a gain signal and that converts the gain signal into the control signal and the further control signal.

The first sub-circuit comprises a first transistor 33 operated in a triode region. This first transistor 33 comprises a control electrode (gate) coupled to the input 32 for receiving the input signal. The second sub-circuit comprises a second transistor 34 comprising a first main electrode (drain) coupled to the third sub-circuit and comprising a second main electrode (source) coupled to a first main electrode (drain) of the first transistor 33. The third sub-circuit comprises a resistor 35 coupled to the output 31 and to a reference terminal 47. A second main electrode (source) of the first transistor 33 is coupled to ground. The respective first and second and third sub-circuits form a serial path.

The further first sub-circuit comprises a further first transistor 53 operated in a triode region. This further first transistor 53 comprises a control electrode (gate) coupled to the further input 52 for receiving the further input signal. The further second sub-circuit comprises a further second transistor 54 comprising a first main electrode (drain) coupled to the further third sub-circuit and comprising a second main electrode (source) coupled to a first main electrode (drain) of the further first transistor 53. The further third sub-circuit comprises a further resistor 55 coupled to the further output 51 and to a reference terminal 47. A second main electrode (source) of the further first transistor 53 is coupled to ground. The respective further first and further second and further third sub-circuits form a further serial path.

The second circuit 4 comprises a current source 6 coupled to a first main electrode (drain) of a third transistor 41 and to a first main electrode (drain) and a control electrode (gate) of a fourth transistor 42. A control electrode (gate) of the third transistor 41 is coupled to a control electrode (gate) of the second transistor 34 and a second main electrode (source) of the third transistor 41 is coupled to a second main electrode (source) of the second transistor 34. A second main electrode (source) of the fourth transistor 42 is coupled to a voltage source 9 for generating the gain signal.

The second circuit 4 further comprises an other current source 7 coupled to a first main electrode (drain) of a further third transistor 43 and to a first main electrode (drain) and a control electrode (gate) of a further fourth transistor 44. A control electrode (gate) of the further third transistor 43 is coupled to a control electrode (gate) of the further second transistor 54 and a second main electrode (source) of the further third transistor 43 is coupled to a second main electrode (source) of the further second transistor 54. A second main electrode (source) of the further fourth transistor 44 is coupled to the voltage source 9 for generating the gain signal.

This way, the control signal (the voltage at the source of the transistor 34 or the voltage at the drain of the transistor 33) and the further control signal (the voltage at the source of the transistor 54 or the voltage at the drain of the transistor 53) are copies of the gain signal (the voltage generated by the voltage source 9).

The current source 6 comprises a fifth and a sixth transistor 61 and 62, a first main electrode (drain) of the fifth transistor 61 being coupled to the first main electrode of the third transistor 41 and to the first main electrode and the control electrode of the fourth transistor 42. A first main electrode (drain) of the sixth transistor 62 is coupled to a first main electrode (drain) of a seventh transistor 45. A control electrode (gate) of the seventh transistor 45 is coupled to the control electrode of the second transistor 34 and a second main electrode (source) of the seventh transistor 45 is coupled to the second main electrode of the second transistor 34. Control electrodes (gates) of the fifth and sixth transistors 61 and 62 are coupled to each other and to the first main electrode of the sixth transistor 62. Second main electrodes (sources) of the fifth and sixth transistors 61 and 62 are coupled to a reference terminal 47.

The other current source 7 comprises a further fifth and the sixth transistor 71 and 62, a first main electrode (drain) of the further fifth transistor 71 being coupled to the first main electrode of the further third transistor 43 and to the first main electrode and the control electrode of the further fourth transistor 44. A first main electrode (drain) of the sixth transistor 62 is further coupled to a first main electrode (drain) of a further seventh transistor 46. A control electrode (gate) of the further seventh transistor 46 is coupled to the control electrode of the further second transistor 54 and a second main electrode (source) of the further seventh transistor 46 is coupled to the second main electrode of the further second transistor 54. Control electrodes (gates) of the further fifth and sixth transistors 71 and 62 are coupled to each other. Second main electrodes (sources) of the further fifth and sixth transistors 71 and 62 are coupled to a reference terminal 47. The control electrodes of the fifth and sixth and further fifth transistors 61 and 62 and 71 are further coupled via a capacitor 63 to a reference terminal 47.

The feedback-less amplifiers 16,19,26,29 further comprise a third circuit 8 for compensating a common mode current. The third circuit 8 comprises an eleventh transistor 81 comprising a control electrode (gate) coupled to the control electrode of the first transistor 33 and comprising a first main electrode (drain) coupled to the second main electrode of the fourth transistor 42 and comprising a second main electrode (source) coupled to the second main electrode of the first transistor 33. The third circuit 8 further comprises a further eleventh transistor 82 comprising a control electrode (gate) coupled to the control electrode of the further first transistor 53 and comprising a first main electrode (drain) coupled to the second main electrode of the further fourth transistor 44 and comprising a second main electrode (source) coupled to the second main electrode of the further first transistor 53.

Figure 4:
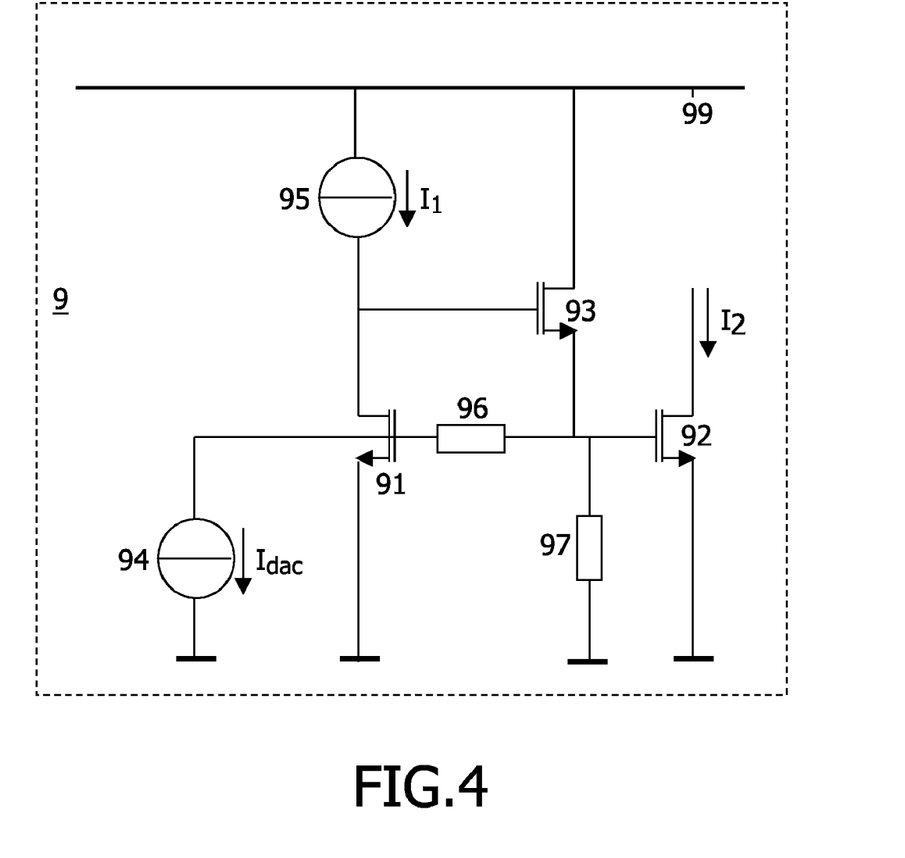
FIG. 4 shows diagrammatically a voltage source for use in the feedback-less amplifier according to the invention.

The voltage source 9 shown in FIG. 4 comprises a further resistor coupled to a further current source 94. This further resistor comprises an eighth transistor 91, a ninth transistor 92 and a tenth transistor 93. The eighth transistor 91 comprises a control electrode (gate) coupled via the further current source 94 (indicating a current source corresponding with a digital to analog converter) to ground and via a yet further resistor 96 (indicating an output resistance of the digital to analog converter) to a control electrode (gate) of the ninth transistor 92 and a second main electrode (source) of the tenth transistor 93. The eighth transistor 91 comprises a first main electrode (drain) coupled to a control electrode (gate) of the tenth transistor 93 and via a yet further current source 95 to a reference terminal 99. The tenth transistor 93 comprises a first main electrode (drain) coupled to the reference terminal 99. The eighth and ninth transistors 91 and 92 comprise second main electrodes (sources) coupled to ground, and the control electrode of the ninth transistor 92 is further coupled via a biasing resistor 97 to ground.

The feedback-less amplifier shown in FIG. 3 functions as follows. An input differential voltage with an input common mode voltage is applied to the gates of the input transistors 33 and 53 that are operated in their triode region. The operation of a transistor in its triode region is common in the art. The resistance values of the transistors 33 and 53 depend on the input drive voltages and the drain-source voltages imposed by the upper elements. In case a differential voltage drive is supplied to the inputs 32 and 52, a differential current $2Io(1+x)$ will for example flow through the transistor 33 and a differential current $2Io(1-x)$ will for example flow through the transistor 53. The transistors 34 and 41 (54 and 43) will have the same gate-source voltages and therefore they will conduct the same drain currents thereby neglecting drain-induced effects. The currents of the transistors 41 and 43 are subtracted from the two current sources 6 and 7 each generating a current $2Io$ and the difference currents are directed in the transistors 44 and 42 as $Io(1+x)$ and $Io(1-x)$ respectively.

As a consequence, the gate-source voltages of 34, 41 and 44 will match dynamically. The same holds for the transistors 54, 43 and 42. As a result, the voltage $V_{agc}$ (agc=automatic gain control) generated by the voltage source 9 will be reproduced at the drains of the transistors 33 and 53. Given the triode operation of the transistors 33 and 53 (the input common-mode voltage is chosen as such):

$$i_{drain33}=\mu_n C_{ox} W/L[(V_{in33}-V_T)V_{agc}+V_{agc}^2/2]$$

$$i_{drain53}=\mu_n C_{ox} W/L[(V_{in53}-V_T)V_{agc}+V_{agc}^2/2]$$

A differential output current of the triode transistors 33 and 53 then becomes:

$$i_{diff\text{-}out}=i_{drain33}-i_{drain53}=\mu_n C_{ox} W/L[(V_{in33}-V_{in53})V_{agc}]$$

So, the output differential current depends linearly on the input differential voltage and the voltage $V_{agc}$. Hence, the differential output voltage becomes:

$$V_{diff\text{-}out}=V_{31}-V_{51}=R\mu_n C_{ox} W/L[(V_{in33}-V_{in53})V_{agc}]$$

The gain G of the amplifier then becomes:

$$G=v_{diff\text{-}out}/(v_{31}-v_{51})=R\mu_n C_{ox} W/L V_{agc}$$

About the current sources 6 and 7, a problem of how to generate the currents $2Io$ twice (current source 6 should generate a current $2Io$ and current source 7 should generate a current $2Io$) is solved by the implementations of the current sources 6 and 7 as shown in FIG. 3 and by having introduced the transistors 45 and 46. Through each one of the transistors 34, 45, 41 and 44, for example a current $Io(1+x)$ will flow, and through each one of the transistors 54, 46, 43 and 42, for example a current $Io(1-x)$ will flow.

About the third circuit 8 for compensating a common mode current, a 3:1 replica of the transistors 33 and 53 here denoted 81 and 82 respectively absorbs the source current of the transistors 44 and 42. The transistors 81 and 82 have the same drain-source voltages as their replica's 33 and 53. Due to this compensation, any voltage source present in the sources of the transistors 44 and 42 does not absorb any dc current. The flow of the signal currents is such that ac signals of the transistors 44 and 42 only flow through the transistors 44 and 42. The same holds for the transistors 81 and 82.

About the voltage source 9 shown in FIG. 4, the gain signal or voltage $V_{agc}$ is generated from a current $I_{dac}$ of a digital to analog converter and a further resistor denoted $R_x$. The gain signal or voltage $V_{agc}$ is $I_{dac}R_x$ and the gain of the amplifier is:

$$G=R\mu_n C_{ox} W/L V_{agc}=R\mu_n C_{ox} W/L I_{dac}R_x$$

The current $I_{dac}$ generated by the digital to analog converter will totally flow through the resistor $R_x$. When $I_{dac}=0$ the only solution that fulfils a dc conditions is $V_{agc}=V_{ds}=0$ and the dc current is zero. By increasing $I_{dac}$, the drain-source voltages of the triode transistors 33 and 53 will raise and, as a consequence, the drain currents of the triode transistors 33 and 53 increase.

When a linear in dB gain control is desired, the further resistor $R_x$ might be implemented as shown in FIG. 4. The biasing resistor 97 keeps the transistor 93 under a constant bias current even when $I_{dac}$ is zero. When the transistors 91 and 92 are operated in their sub-threshold region, the drain currents of the transistors are:

$$I_{ds91}=I_{n0}W/L\exp[V_{gs91}/(nU_T)]$$

$$I_{ds92}=I_{n0}W/L\exp[V_{gs92}/(nU_T)]$$

The currents $I_{n0}$ are technology and temperature dependent and $U_T=kT/q$. Then:

$$V_{gs91}-V_{gs92}=I_{dac}R_{dac}=nU_T\ln(I_2/I_1)$$

This leads to:

$$I_2=I_1\exp[I_{dac}R_{dac}/(nU_T)]$$

whereby $I_1$ is the current generated by the yet further current source 95 and $I_2$ is the current to be injected into the drain of the transistor 92. When $I_{dac}$ is generated from $I_2$ (mirrored copy) the gain of the amplifier becomes:

$$G = R\mu_n C_{ox} W/L I_{dac} R_x = R\mu_n C_{ox} W/L R_x I_1 \exp[I_{dac} R_{dac}/nU_T]$$

The result is a linear in dB gain control together with a linear relationship between the (singular or differential) output signal and the (singular or differential) input signal.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. Use of the verb "to comprise" and its conjugations does not exclude the presence of elements or steps other than those stated in a claim. The article "a" or "an" preceding an element does not exclude the presence of a plurality of such elements. The invention may be implemented by means of hardware comprising several distinct elements, and by means of a suitably programmed computer. In the device claim enumerating several means, several of these means may be embodied by one and the same item of hardware. The mere fact that certain measures are recited in mutually different dependent claims does not indicate that a combination of these measures cannot be used to advantage.

What is claimed is:

1. Device comprising a feedback-less amplifier, the feedback-less amplifier comprising:
   a first circuit comprising a first sub-circuit configured to receive an input signal and a second sub-circuit configured to receive a control signal and a third sub-circuit configured to generate an output signal, the respective first and second and third sub-circuits forming a serial path; and
   a second circuit configured to receive a gain signal and to convert the gain signal into the control signal,
   wherein the control signal is applied to the serial path between the first and the second sub-circuit.

2. Device according to claim 1, the first sub-circuit comprising a first transistor configured to operate in a triode region, the first transistor comprising a control electrode configured to receive the input signal.

3. Device according to claim 2, the second sub-circuit comprising a second transistor, the second transistor comprising a first main electrode coupled to the third sub-circuit and comprising a second main electrode coupled to a first main electrode of the first transistor.

4. Device according to claim 3, the third sub-circuit comprising a resistor.

5. Device according to claim 1, the control signal being a copy of the gain signal.

6. Device according to claim 3, the second circuit comprising a current source coupled to a first main electrode of a third transistor and to a first main electrode and a control electrode of a fourth transistor, a control electrode of the third transistor being coupled to a control electrode of the second transistor and a second main electrode of the third transistor being coupled to a second main electrode of the second transistor, and a second main electrode of the fourth transistor being coupled to a voltage source for generating the gain signal.

7. Device according to claim 6, the current source comprising a fifth and a sixth transistor, a first main electrode of the fifth transistor being coupled to the first main electrode of the third transistor and to the first main electrode and the control electrode of the fourth transistor, a first main electrode of the sixth transistor being coupled to a first main electrode of a seventh transistor, a control electrode of the seventh transistor being coupled to the control electrode of the second transistor and a second main electrode of the seventh transistor being coupled to the second main electrode of the second transistor, and control electrodes of the fifth and sixth transistors being coupled to each other and to the first main electrode of the sixth transistor.

8. Device according to claim 7, the control electrodes of the fifth and sixth transistors further being coupled via a capacitor to a reference terminal.

9. Device according to claim 6, the voltage source comprising a further resistor coupled to a further current source.

10. Device according to claim 9, the further resistor comprising an eighth transistor, a ninth transistor and a tenth transistor, the eighth transistor comprising a control electrode coupled to the further current source and via a yet further resistor to a control electrode of the ninth transistor and a second main electrode of the tenth transistor, the eighth transistor comprising a first main electrode coupled to a control electrode of the tenth transistor and via a yet further current source to a reference terminal, the tenth transistor comprising a first main electrode coupled to the reference terminal, the eighth and ninth transistors comprising second main electrodes coupled to ground, and the control electrode of the ninth transistor being coupled via a biasing resistor to ground.

11. Device according to claim 1, further comprising a third circuit configured to compensate a common mode current.

12. Device according to claim 11, the third circuit comprising an eleventh transistor the eleventh transistor comprising a control electrode coupled to the control electrode of the first transistor and comprising a first main electrode coupled to the second main electrode of the fourth transistor and comprising a second main electrode coupled to the second main electrode of the first transistor.

13. Feedback-less amplifier comprising:
    a first circuit comprising a first sub-circuit configured to receive an input signal and a second sub-circuit configured to receive a control signal and a third sub-circuit configured to generate an output signal, the respective first and second and third sub-circuits forming a serial path; and
    a second circuit configured to receive a gain signal and to convert the gain signal into the control signal,
    wherein the control signal is applied to the serial path between the first and the second sub-circuit.

14. Feedback-less amplifying method comprising:
    receiving an input signal via a first sub-circuit of a first circuit;
    receiving a control signal via a second sub-circuit of the first circuit;
    generating an output signal via a third sub-circuit of the first circuit; and
    receiving a gain signal and converting the gain signal into the control signal via a second circuit,
    wherein the respective first and second and third sub-circuits form a serial path, and
    wherein the control signal is applied to the serial path between the first and the second sub-circuit.

15. The method according to claim 14, further comprising:
    operating a first transistor of the first sub-circuit in a triode region, the first transistor comprising a control electrode configured to receive the input signal.

16. The method according to claim 15, wherein the second sub-circuit comprises a second transistor, the second transistor comprises a first main electrode coupled to the third sub-circuit and comprises a second main electrode coupled to a first main electrode of the first transistor.

17. The method according to claim 16, wherein the second circuit comprises a current source coupled to a first main electrode of a third transistor and to a first main electrode and a control electrode of a fourth transistor, a control electrode of the third transistor being coupled to a control electrode of the second transistor and a second main electrode of the third transistor being coupled to a second main electrode of the second transistor, and a second main electrode of the fourth transistor being coupled to a voltage source for generating the gain signal.

18. The amplifier according to claim 13, the first sub-circuit comprising a first transistor configured to operate in a triode region, the first transistor comprising a control electrode configured to receive the input signal.

19. The amplifier according to claim 18, the second sub-circuit comprising a second transistor, the second transistor comprising a first main electrode coupled to the third sub-circuit and comprising a second main electrode coupled to a first main electrode of the first transistor.

20. The amplifier according to claim 19, the second circuit comprising a current source coupled to a first main electrode of a third transistor and to a first main electrode and a control electrode of a fourth transistor, a control electrode of the third transistor being coupled to a control electrode of the second transistor and a second main electrode of the third transistor being coupled to a second main electrode of the second transistor, and a second main electrode of the fourth transistor being coupled to a voltage source for generating the gain signal.

* * * * *